(12) United States Patent
Nakahara et al.

(10) Patent No.: US 6,931,039 B2
(45) Date of Patent: Aug. 16, 2005

(54) OPTICAL TRANSMITTER EQUIPMENT AND SEMICONDUCTOR LASER DEVICE

(75) Inventors: Kouji Nakahara, Kunitachi (JP); Ryoji Takeyari, Koganei (JP)

(73) Assignee: Hitachi, Ltd., Tokyo (JP)

( * ) Notice: Subject to any disclaimer, the term of this patent is extended or adjusted under 35 U.S.C. 154(b) by 171 days.

(21) Appl. No.: 10/412,425

(22) Filed: Apr. 14, 2003

(65) Prior Publication Data

US 2004/0028100 A1 Feb. 12, 2004

(30) Foreign Application Priority Data

Aug. 9, 2002 (JP) .................................... P2002-232497

(51) Int. Cl.$^7$ .............................. H01S 3/00; H01S 5/00
(52) U.S. Cl. ................................ 372/38.02; 372/75
(58) Field of Search ........................... 372/75, 50, 38, 372/45, 38.02, 96

(56) References Cited

U.S. PATENT DOCUMENTS

| | | | | |
|---|---|---|---|---|
| 4,802,182 A | * | 1/1989 | Thornton et al. | 372/50 |
| 5,252,839 A | * | 10/1993 | Fouquet | 257/13 |
| 5,513,204 A | * | 4/1996 | Jayaraman | 372/96 |
| 6,252,895 B1 | * | 6/2001 | Nitta et al. | 372/50 |
| 6,331,990 B1 | * | 12/2001 | Parker et al. | 372/8 |
| 6,714,574 B2 | * | 3/2004 | Clayton et al. | 372/50 |
| 2002/0075935 A1 | * | 6/2002 | Clayton | 372/75 |
| 2002/0146053 A1 | * | 10/2002 | Iwai | 372/75 |

* cited by examiner

*Primary Examiner*—Don Wong
*Assistant Examiner*—Hung Tran Vy
(74) *Attorney, Agent, or Firm*—Reed Smith LLP; Stanley P. Fisher, Esq.; Juan Carlos A. Marquez, Esq.

(57) ABSTRACT

Optical transmitter equipment and a semiconductor laser device are provided. In one example, optical transmitter equipment includes a semiconductor laser driven by a direct-modulated method. The optical transmitter equipment comprises at least a semiconductor laser, the semiconductor laser having an active layer for laser oscillation and a clad region for optical confinement; an emission device capable of supplying optical energy to the active layer in the semiconductor laser; and a drive circuit for the semiconductor laser. The emission device is configured to supply optical energy corresponding to a bias current in the semiconductor laser to the active layer in the semiconductor laser.

2 Claims, 6 Drawing Sheets

OPTICAL TRANSMITTER EQUIPMENT AND SEMICONDUCTOR LASER DEVICE

BACKGROUND OF THE INVENTION

1. Field of the Invention

The present invention generally relates to optical transmitter equipment and, more particularly, to optical transmitter equipment using a semiconductor laser.

2. Discussion of Background

In optical transmitter equipment for optical communication using optical fiber, a semiconductor laser is used as a light source. As one method for optical modulation in the semiconductor laser there widely is adopted a direct modulation method wherein the intensity of laser beam is modulated by increasing or decreasing a current flowing through the semiconductor laser. For the optical transmitter equipment using such a direct modulation type semiconductor laser it is required increase the optical communication speed to meet the demand for a larger capacity. For the speed-up of optical communication it is important to attain the following subjects:

(1) Improvement of a relaxation oscillation frequency in the semiconductor laser
(2) Speed-up of a driver circuit
(3) Decrease of parasitic capacitance These subjects are now in the following stages of development, respectively. As to the above subject (1), researches and developments have been made positively in the field of semiconductor laser. As to the above subject (2), a high-speed operation at 10 Gb/s has been attained by microfabrication and structural optimization of an npn bipolar transistor and by the adoption an SiGe material instead of the conventional Si. The above subject (3) is common to all of semiconductor laser, driver circuit, and associated circuits.

Particularly, for a high-speed operation of 10 Gb/s or more, it is extremely important to achieve not only the above subjects (1) and (2) but also the above subject (3).

Figure 2:
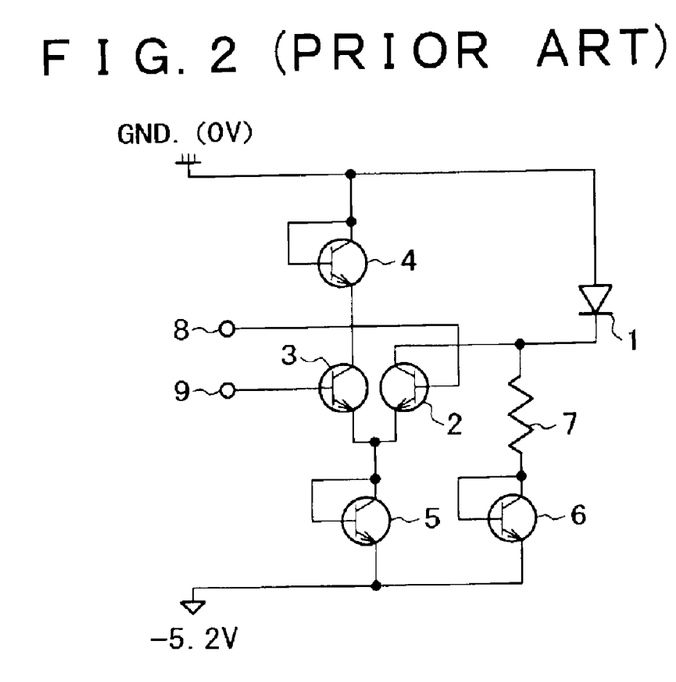
FIG. 2 is a conventional circuit diagram.

In order to clarify problems with parasitic capacitance, reference will now be made to a schematic circuit diagram of FIG. 2 in which a semiconductor laser and a driver circuit are connected together. FIG. 2 shows a typical circuit example in which a differential amplified circuit is connected to a semiconductor laser. In the same figure, the numeral 1 denotes a laser, numerals 2 and 3 denote transistors for the differential amplified circuit, numeral 4 denotes a constant current transistor serving as a load on the transistor 3, numeral 5 denotes a constant current transistor for the differential amplified circuit, numeral 6 denotes a constant current circuit for the application of bias to the semiconductor laser 1, and numeral 7 denotes a resistor. Further, in FIG. 2, the numerals 8 and 9 denote input signal terminals in the differential amplified circuit, to which is connected a preceding circuit usually integral with the circuit in question in the form of an IC.

Figure 3:
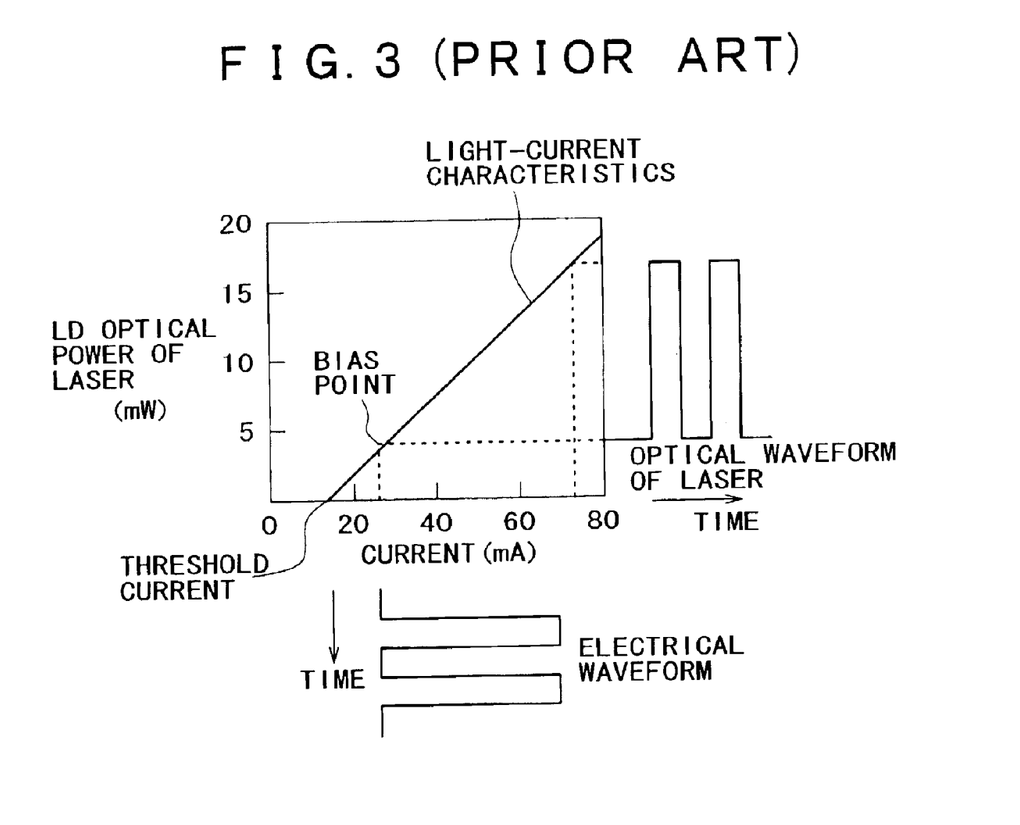
FIG. 3 shows a relation between a current fed to a semiconductor laser and an optical power of the laser, as well as a relation between a signal current waveform in the use of the semiconductor laser and the waveform of a corresponding optical power of the laser.

FIG. 3 shows a relation between a current fed to a semiconductor laser and an optical power of the laser, as well as a relation between a signal current waveform in the use of the semiconductor laser and the waveform of a corresponding optical power of the laser. When the input waveform of FIG. 3 is considered, the semiconductor laser has light-current characteristics such that an optical power of laser is provided at an input current value of above a threshold current value, so the addition of a bias current is required up to a bias point. In the example shown in FIG. 3, the bias current is fed by the constant current circuit 6. More specifically, a current is fed up to a bias point by a constant current transistor (constant current circuit 6) and a rectangular current corresponding to an electrical waveform is further fed by the transistor 2. As a result of the supply of the rectangular current, an optical waveform is outputted from an emission end of the laser. These are the main point of driving the semiconductor laser. It is an example of light-current characteristics of the semiconductor laser at 85° C. that is illustrated in FIG. 3.

Figure 4:
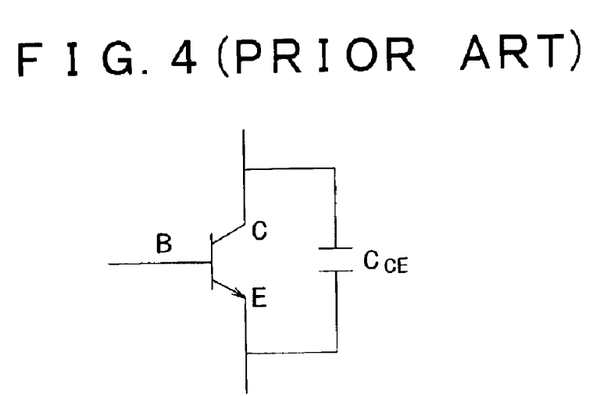
FIG. 4 is a circuit diagram of a transistor having a parasitic capacitance present between a collector and an emitter.

In such a circuit configuration, a parasitic capacitance is added mainly in parallel with the semiconductor laser and a transistor and obstructs the speed-up of circuit operation. For example, in the case of a transistor, a parasitic capacitance $C_{CE}$ is present between a collector C and an emitter E equivalently, as shown in FIG. 4.

Figure 5:
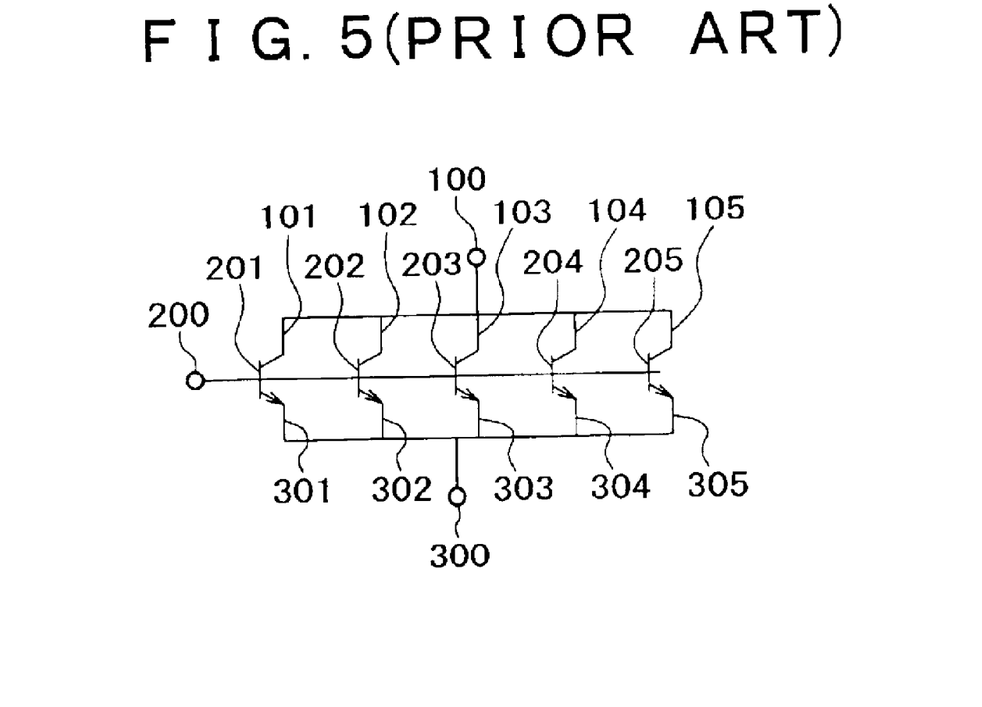
FIG. 5 is a circuit diagram showing transistors operating in parallel.

In FIG. 2, for showing a principle, the transistors 2 and 3 used in the driver circuit of this example are each represented in terms of a single transistor symbol. However, in constituting an actual equipment concretely, the transistor represented by such a single symbol is in form of a parallel connection of plural transistors to increase a maximum output current. An example of this connection is shown in FIG. 5, in which transistors are paralleled in five stages. In the same figure, the numerals 101–105 denote collectors, numerals 201–205 denote bases, and numerals 301–305 denote emitters, of the respective transistors. In this example, five transistors are arranged in parallel and, as a whole, function as a transistor composed of a collector 100, a base 200 and an emitter 300 and capable of carrying a large amount of current. Particularly, for allowing the semiconductor transistor to operate at 10 Gb/s or more, a large current of about 50 mA in amplitude is needed and therefore it is essential that the transistors 2 and 3 be paralleled as in FIG. 5. Thus, since a large number of individual transistors are used, a parasitic capacitance for the circuit concerned also becomes large as a whole.

Further, in FIG. 2, also as to the transistor 6 for a bias current to be fed to the semiconductor laser 1, there usually is adopted a parallel configuration, in which the number of parallel stages is about the same as in the case of the transistors 2 and 3. Consequently, a parasitic capacitance for this transistor circuit is also large.

Now there will be shown a concrete example in which the number of parallel stages and parasitic capacitance of the bias transistor 6 become large. The bias current which the bias transistor 6 supplies is, for example, 25 mA or so, which is half of that supplied by the transistors 2 and 3. However, the bias current is a constant current, while the transistors 2 and 3 in the differential amplified circuit operate at a high speed under the conditions of rectangle wave, amplitude 50 mA, and minimum current 0 mA, with an averaging value being 25 mA. Usually, therefore, the number of parallel stages in the transistors 2, 3 and that in the bias transistor 6 are almost the same.

The number of parallel stages and maximum output current in a transistor depend on a calorific value of the transistor. A resistor 7 is connected in series with the bias transistor 6. If its resistance value is set very large, the parasitic capacitance of the transistor 6 ought to become less influential. However, with such a low source voltage as −5.2V, the resistance value of the resistor 7 cannot be made large. Thus, it is the actual situation that the attainment of a high speed is obstructed by the parasitic capacitance of the transistor 6.

SUMMARY OF THE INVENTION

Broadly speaking, the present invention provides optical transmitter equipment capable of diminishing a parasitic capacitance present within a circuit and thereby attaining a high-speed operation easily. Further, the present invention permits a direct and high-speed modulation of a semiconductor laser drive current. It should be appreciated that the present invention can be implemented in numerous ways, including as a process, an apparatus, a system, a device or a method. Several inventive embodiments of the present invention are described below.

In one embodiment, optical transmitter equipment having a semiconductor laser device in which a first semiconductor laser for transmission is connected to an output of a semiconductor laser drive circuit. An emission device is provided to supply an optical energy corresponding to a bias current of the first semiconductor laser to an active layer of the same laser.

Also, a semiconductor laser device which permits a practical use of such optical transmitter equipment.

In a typical mode of the optical transmitter equipment, a p side of a first laser for transmission is connected to a source voltage side, while an n side is connected to an output of a drive circuit. The drive circuit functions to modulate a drive current for the said semiconductor laser and is also connected to one end of a first constant current circuit.

Further, there is provided an emission device which supplies optical energy corresponding to a bias current for the said semiconductor laser, as well as a second constant current circuit for causing the emission device to emit light.

It is useful for an output current from the second constant current circuit to be larger than that from the first constant current circuit. As a result of the supply of optical energy according to the present invention there inevitably decreases an electrical supply by the first constant current circuit.

Further, it is important that a parasitic capacitance which the first constant current circuit is smaller than a parasitic capacitance connected to the semiconductor laser side of the drive circuit.

According to a typical optical energy supply method, excitation light from the emission device is incident on an active layer of the semiconductor laser in a direction perpendicular to an optical axis of emission light from the semiconductor laser. That is, the excitation light is fed from a side face or an upper surface of an optical resonator of the laser. Such a typical mode is provided by a semiconductor integrated circuit device.

On a substrate there are formed a first semiconductor layer, the first semiconductor layer having an active layer for laser emission and a clad region for optical confinement in which active layer light travels in a longitudinal direction, as well as a second semiconductor layer having an active layer for laser emission and a clad region for optical confinement. One side face of the second semiconductor layer is opposed to a side face parallel to the longitudinal direction of the first semiconductor layer, and the active layer of the second semiconductor layer in this side face is opposed to a side face of the active layer of the first semiconductor layer.

Each semiconductor laser has a characteristic such that emission light by the second semiconductor layer permits the supply of optical energy corresponding to a bias current which is for laser emission by the first semiconductor layer. An example of a basic configuration of each semiconductor laser itself is one that is Fabry-Perot type, distributed feedback type, distributed Bragg reflector, and vertical cavity surface emitting laser.

It is practical that the wavelength of excitation light from the emission device is shorter than that of emission light from the semiconductor laser concerned. This relation is preferable from the standpoint of preventing noise caused by the excitation light and also from the standpoint of optical energy supply.

The emission device may be constituted as a beam-expanded laser. The use of a conventional beam expanding means using a semiconductor layer suffices. Beam is expanded to ensure optical coupling of both semiconductor lasers.

The invention encompasses other embodiments of a method, an apparatus, and a system which are configured as set forth above and with other features and alternatives.

BRIEF DESCRIPTION OF THE DRAWINGS

The present invention will be readily understood by the following detailed description in conjunction with the accompanying drawings. To facilitate this-description, like reference numerals designate like structural elements.

DESCRIPTION OF THE PREFERRED EMBODIMENTS

An invention for optical transmitter equipment is disclosed. Numerous specific details are set forth in order to provide a thorough understanding of the present invention. It will be understood, however, to one skilled in the art, that the present invention may be practiced without some or all of these specific details.

Figure 1:
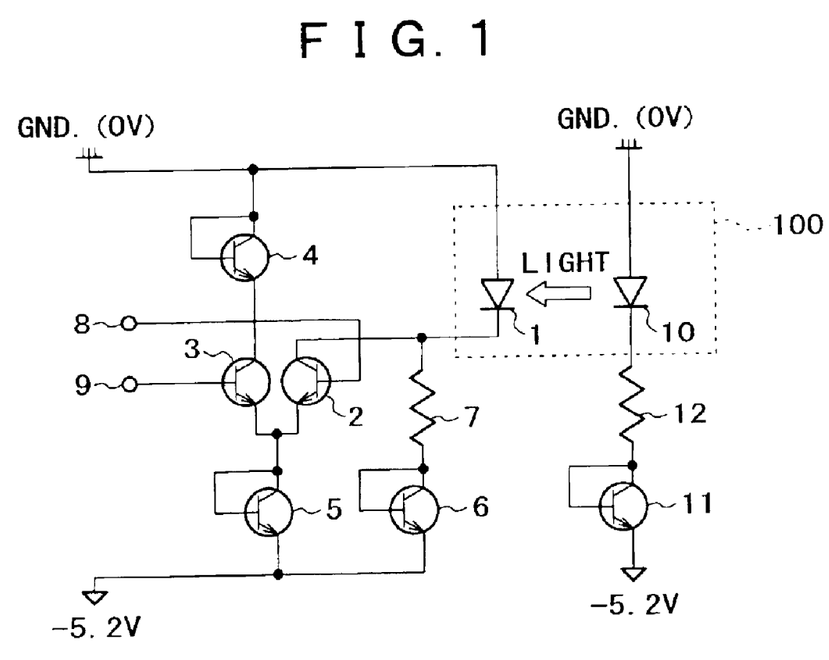
FIG. 1 is a circuit diagram illustrating an embodiment of the present invention.

FIG. 1 is a circuit diagram illustrating an embodiment of the present invention in which the invention is applied to a 1.3 $\mu$m optical transmitter equipment. In FIG. 1, the right-hand side shows a region of a semiconductor laser for optical excitation and the left-hand side shows a region of a semiconductor laser for optical transmission and an example of a drive circuit for the said semiconductor laser. An area 100 enclosed with a dotted line is usually constituted by an optical integrated circuit device which comprises a compound semiconductor for example. A concrete configuration thereof will be described later. Other circuits such as, for example, a differential amplified circuit and each constant current circuit are constituted by conventional circuits of a silicon-based material.

To a semiconductor laser 10 for optical excitation is connected through a resistor 12 a constant current circuit 11 for driving the semiconductor laser 10. A device structure is designed so that laser beam emitted from the semiconductor laser 10 efficiently reaches an active layer of a semiconductor laser 1 for optical transmission. With this light, not a current, the semiconductor laser 1 for optical transmission is biased equivalently to the biased state up to point A in FIG. 3 as referred to previously. If in this state the illustrated rectangular electric current is inputted to the semiconductor laser 1 from the drive circuit, there can be obtained an optical power of such a waveform as shown in FIG. 3.

As to the drive circuit itself, a conventional one suffices, for example the one illustrated in FIG. 2. As to a constant current transistor 6, it will be described later.

Transistors 2 and 3 constitute a differential amplified circuit. The semiconductor laser 1 is connected to the collector of the transistor 2 which is for the differential amplified circuit. On the other hand, a constant current transistor 4 is connected to the load of the transistor which is for the differential amplified circuit. The numeral 5 denotes a constant current transistor for the differential amplified circuit, numeral 6 denotes a constant current circuit for biasing the semiconductor laser 1, and numeral 7 denotes a resistor.

A description will now be given about the use of the constant current transistor 6. Also in the example shown in FIG. 1 there is provided the constant current transistor 6 for biasing. This is for preventing the potential of a connection line between the semiconductor laser 1 and the output transistor 2 from becoming unstable even when an output current of the output transistor 2 in the differential amplified circuit 2 becomes 0 mA, i.e., cut-off state. Thus, the required current is in the range of 0.01 mA to 0.1 mA, which is a magnitude corresponding to 1/250–1/2500 of the conventional required current. Consequently, a transistor of a small parasitic capacitance is employable as the transistor 6. In this way it was possible to implement optical transmitter equipment with little deterioration in high-speed performance of the semiconductor laser caused by the bias circuit.

In connection with the structure of the semiconductor laser it is important that light emitted from the semiconductor laser 10 for optical excitation be efficiently introduced into the semiconductor laser 1 for drive. For introducing the light throughout the entire active layer of the semiconductor laser for drive it is basically preferred that the light be introduced in a direction perpendicular to the light emitting direction of the semiconductor laser for drive, i.e., from a side face or an upper surface.

Figure 6:
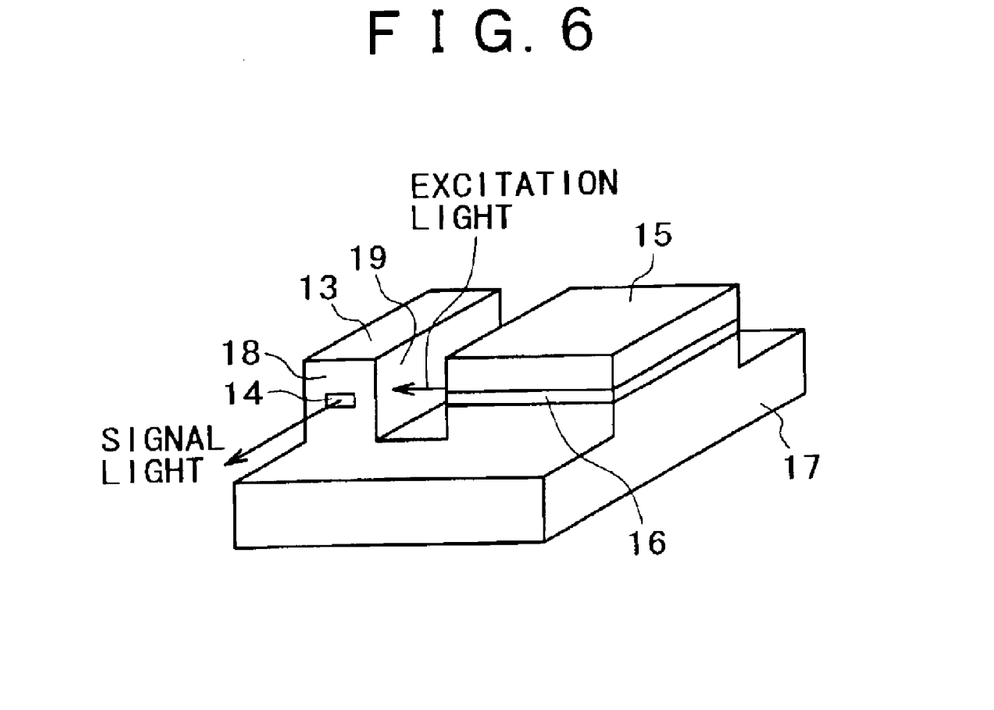
FIG. 6 is a perspective view illustrating optical transmitting equipment of the invention.

In this embodiment, two semiconductor lasers are integrated on the same substrate such as that shown in FIG. 6. As shown in the same figure, a semiconductor laser 13 for drive and a semiconductor laser 15 for optical excitation are arranged on a InP substrate 17 in such a manner that their emission region and active layer are opposed to each other. In this case, from the standpoint of optical coupling it is preferred that the spacing between both semiconductor lasers be narrow. Usually the said spacing is designed in the range of 1 to 10 $\mu$m from the standpoint of coverage of a protective layer onto the semiconductor layer and the resolution in processing using a photoresist.

The resonator length of the semiconductor laser 13 for drive which emits light at a wavelength of 1.30 $\mu$m is 100 $\mu$m and an active layer 14 of the semiconductor laser 13 is constituted by an ordinary multi-quantum well layer using InGaAlAs. The resonator length of the semiconductor laser 15 for optical excitation is 200 $\mu$m. For exciting the semiconductor laser 13 for drive it is preferred for an active layer 16 of the semiconductor laser for optical pumping to be formed such that the emission wavelength of the semiconductor laser for optical excitation is a little shorter than the emission wavelength of the semiconductor laser 13 for drive, that is, a little shorter than the wavelength composition of the active layer in the semiconductor laser 13. Here an active layer with an emission wavelength of 1.29 $\mu$m was allowed to grow by the same crystal growth in accordance with a selective growth method.

An associated wavelength difference is preferably not greater than 300 meV in terms of an energy difference. This energy difference corresponds to not larger than 0.311 $\mu$m in a 1.3 $\mu$m laser and not larger than 0.423 $\mu$m in a 1.55 $\mu$m laser.

Emission end faces 19 and 18 of the semiconductor laser 15 for optical excitation and the semiconductor laser 13 for drive both provided on the InP substrate are each finished as a coated mirror of a high reflectance. The mirror faces 18 and 19 are fabricated by the conventional dry etching method.

A threshold current in the semiconductor laser 13 for drive, which is integrated as in FIG. 6, was found to be 5 mA at 25° C., 14 mA at 85° C., while a threshold current in the semiconductor laser 15 for excitation was found to be 12 mA at 25° C., 24 mA at 85° C. When 18 mA and 36 mA were introduced respectively at 25° C. and 85° C. into the semiconductor laser for excitation, the semiconductor laser 13 for drive oscillated. Appropriate bias conditions were found to be 24 mA at 25° C. and 46 mA at 85° C. in the semiconductor laser for excitation.

In a 1.3 $\mu$m optical transmitter equipment fabricated on the basis of the FIG. 1 circuit using the thus-integrated lasers, a satisfactory eye opening could be obtained at electric currents of 38 mA at 25° C., 48 mA at 85° C., and at a speed of 20 Gb/s. Thus, in this example, a satisfactory operation could be attained at 0°–85° C.

Figure 7:
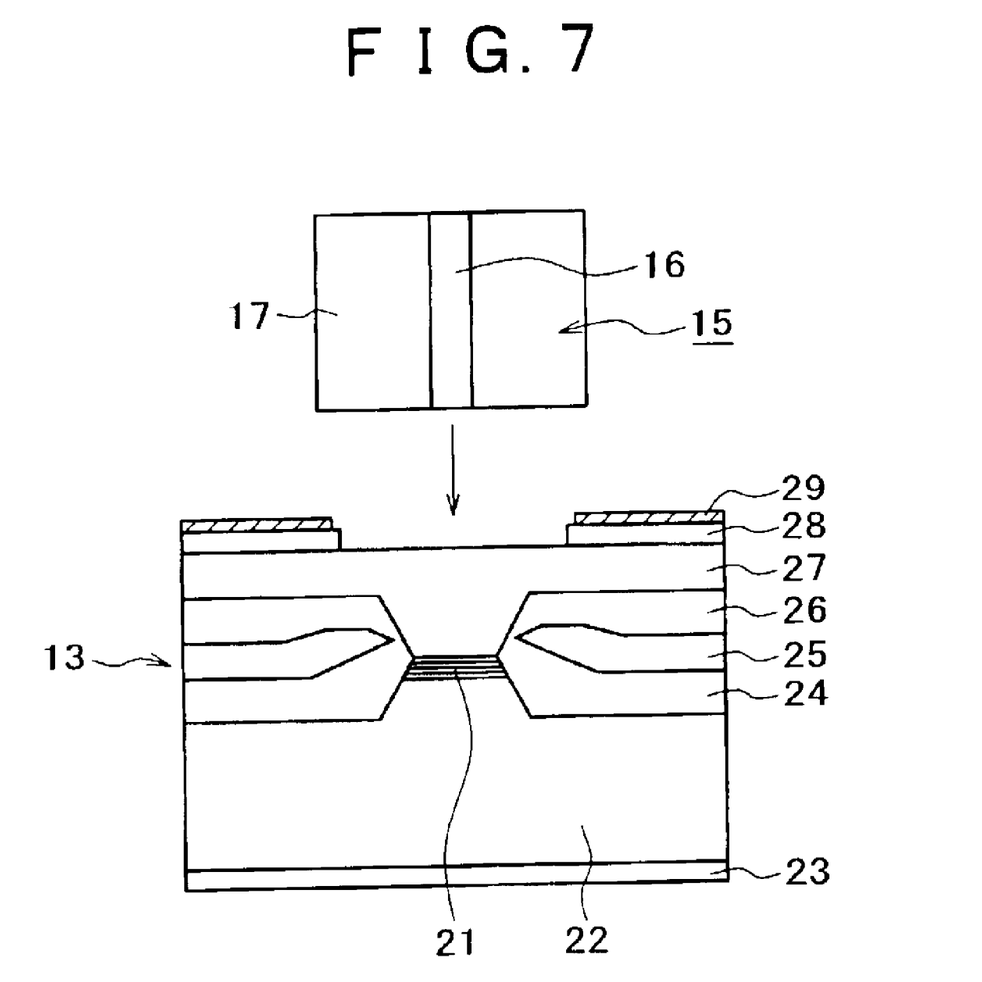
FIG. 7 is a sectional view of optical transmitting equipment showing an example in which excitation light is incident from above.

Next, an example will now be described with reference to FIG. 7 in which optical energy is introduced from an upper surface in the direction of light emission of the semiconductor laser for drive. The semiconductor laser 15 for optical pumping is disposed on the upper surface of the semiconductor laser 13 for drive. In the example of FIG. 7, the semiconductor lasers are fabricated discretely, i.e., each individually. The underlying semiconductor laser 13 for drive is constructed as follows and can be fabricated in a conventional manner. A multi-quantum well layer 21 is formed on an n-type InP substrate 22 and this region is formed in a conventional mesa type stripe shape. On both sides of this stripe shape are formed so-called buried layers, which are a p-type current block layer 24, an n-type current block layer 25, and a p-type current block layer 26. On the base thus prepared are formed a p-type InP layer 27 and an InGaAs layer 28 as an ohmic contact layer. An upper portion of the active layer 21 is removed so that light can be incident on the InGaAs layer 28 from above. On the back side of the n-type InP substrate 22 is formed an n-side ohmic electrode 23, while on the InGaAs layer 28 is formed a p-side ohmic electrode 29.

The InP substrate 17 and the active layer 16 in the semiconductor laser 15 for optical excitation are shown schematically and a detailed explanation thereof will here be omitted because a conventional current constriction structure suffices.

Figure 8:
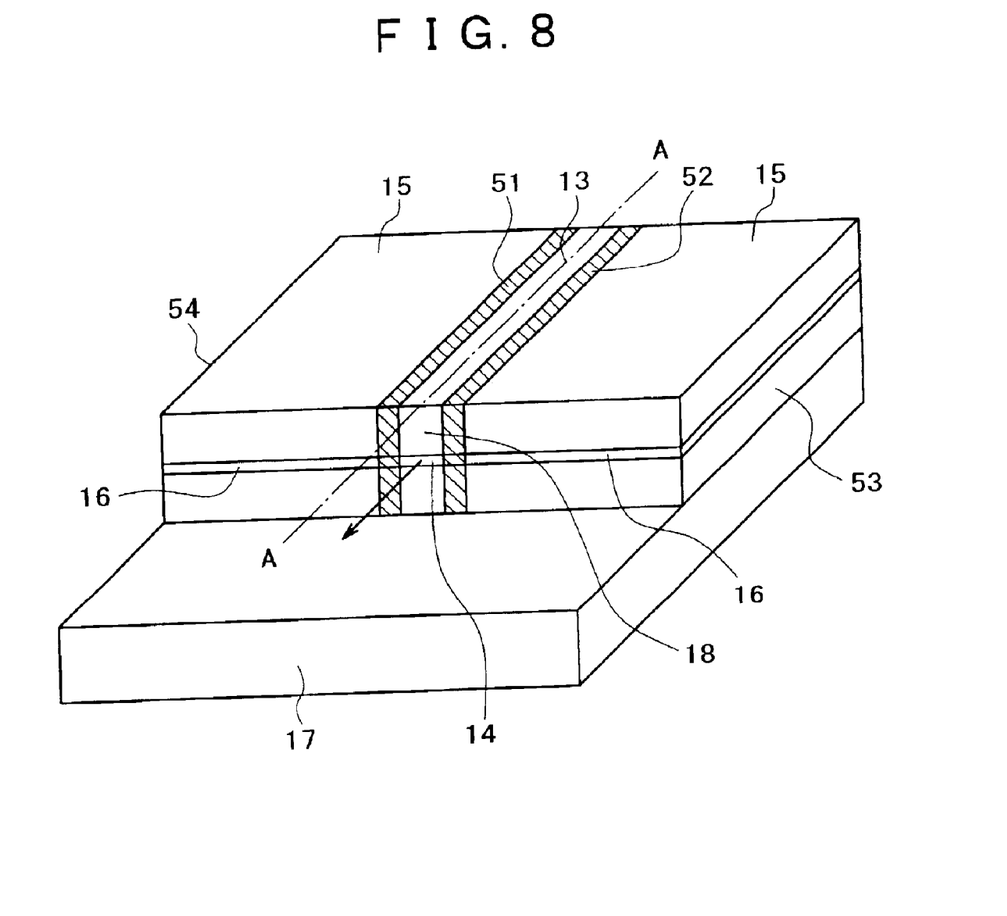
FIG. 8 is a perspective view of optical transmitting equipment illustrating a second embodiment of the invention.

A description will now be given of a second embodiment of the present invention in which the invention is applied to a 1.3 μm optical transmitter equipment. The circuit used in this second embodiment is the same as that used in the first embodiment. There were used integrated semiconductor lasers of such a structure as shown in FIG. 8. In the same figure, the numeral 13 denotes a semiconductor laser for drive, numeral 14 denotes an active layer of the semiconductor laser 13, numeral 15 denotes a semiconductor laser for excitation, numeral 16 denotes an active layer of the semiconductor laser 15, numeral 17 denotes an n-type lnP substrate, numeral 18 denotes a dry etched mirror, numerals 51 and 52 denote semiconductor current block layers formed by Fe-doped InP, and numerals 53 and 54 denote end faces of the semiconductor laser for optical excitation which end faces are formed by cleavage. In the illustrate structure, the semiconductor laser for drive is held in a sandwiched fashion within the resonator of the semiconductor laser for excitation. FIG. 8 is drawn with electrode and coating layer omitted for visualization.

As the semiconductor laser for drive there was used a distributed feedback type semiconductor laser which oscillates at a single wavelength, not the Fabry-Perot type laser used in the first embodiment. A section taken on line A—A' in FIG. 8, i.e., a section of the semiconductor laser for drive, is shown in FIG. 9.

Figure 9:
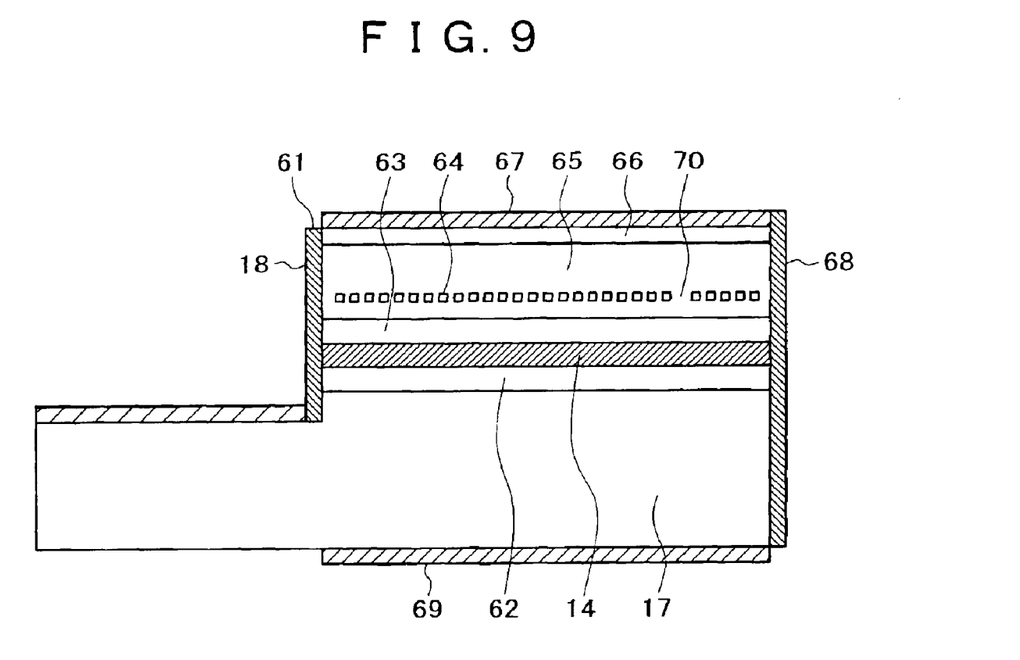
FIG. 9 is a sectional view of optical equipment taken on line A–A' of FIG. 8.

In FIG. 9, a diffraction grating formed of InGaAsP and having λ/4 shift is provided on the active layer 14 so that the semiconductor laser for excitation oscillates in a single mode. Numeral 70 denotes a boundary of λ/4 shift. A coating layer 61 formed on an end face 18 by dry etching has a low reflectance of 0.6%. Numerals 63 and 62 denote optical guide layers, numeral 64 denotes a clad layer, and numeral 66 denotes a contact layer formed of InGaAs which contact layer is for ohmic contact with an upper electrode 67. Numeral 69 denotes a lower electrode and numeral 68 denotes a coating layer formed on a rear end face and having a reflectance of 90%. Emission wavelength was 1.305 μm. As to the device size, the resonator length was set short to 60 μm with a view to attaining high speed.

The resonator length in the semiconductor laser for excitation was set at 400 μm. As the semiconductor laser for excitation there was fabricated a Fabry-Perot type semiconductor laser with 95% coated mirror applied to both end faces because it was not necessary to make the oscillation mode to a single mode nor was it necessary to emit light to the exterior.

A threshold current in the semiconductor laser 13 for drive used in this embodiment was 3.8 mA at 25° C., 9.5 mA at 70° C., while a threshold current in the semiconductor laser 15 for excitation was 4 mA at 25° C., 8 mA at 70° C. When 8.9 mA and 21 mA were introduced respectively at 25° C. and 70° C. into the semiconductor laser for excitation, the semiconductor laser 13 for drive oscillated. Appropriate bias conditions were found to be 14 mA at 25° C. and 30 mA at 70° C. in the semiconductor laser for excitation. Current from a constant current transistor 11 for bias is 0.05 mA and is thus extremely small and a parasitic capacitance of the transistor 11 was found to be extremely small. In a 1.3 μm optical transmitter equipment fabricated on the basis of the FIG. 1 circuit using the thus-integrated lasers, a satisfactory eye opening could be obtained at electric currents of 50 mA at 25° C., 60 mA at 70° C., and at a speed of 40 Gb/s, reflecting the small parasitic capacitance. Thus, in this example, a satisfactory operation of 40 Gb/s could be attained at 0°–70° C.

Although in this embodiment there was used distributed feedback type semiconductor laser as the semiconductor laser for drive, it goes without saying that even if there is used a distributed Bragg reflector or a vertical cavity surface emitting laser, there will be obtained the same effect as above. Moreover, although Fe-doped InP was used as the semiconductor block layer 52, it goes without saying that even if there is used Ru-doped InP, or pnp-stacked InP layer, or InAlAs/Fe-InP-stacked semiconductor block layer, there will be obtained the same effect as above Further, although in this embodiment there was used a semiconductor laser as a device for excitation, it is needless to say that even if there is used a light emitting diode, it is possible to effect excitation.

The present invention is effective in decreasing a parasitic capacitance between a semiconductor laser drive circuit and a semiconductor laser in optical transmitter equipment wherein the semiconductor laser is driven by a direct modulation method.

What is claimed is:

1. Optical transmitter equipment, comprising:
    a first semiconductor laser including an active layer for laser emission and a clad region for optical confinement;
    an emission device capable of supplying optical energy to the active layer in the first semiconductor laser, wherein the emission device is a second semiconductor laser; and
    a drive circuit for the first semiconductor laser, wherein an electrode for p-type semiconductor in the first semiconductor laser is for connection to a power supply side, and wherein an electrode for n-type semiconductor in the first semiconductor laser is connected to the drive circuit for the first semiconductor laser, and wherein the emission device is configured to supply optical energy corresponding to a bias current in the first semiconductor laser to the active layer in the first semiconductor laser, wherein the drive circuit for the first semiconductor laser comprises:
    a differential amplified circuit having a pair of transistors;
    a first constant current circuit connected to an n-type side of the first semiconductor laser;
    a second constant current circuit connected to the differential amplified circuit;
    a load circuit for the differential amplified circuit, the n-type side of the first semiconductor laser being connected to both an output end of the drive circuit and one end of the first constant current circuit; and
    a third constant current circuit connected to one end of the second semiconductor laser, wherein an output current of the third constant current circuit is larger than an output current of the first constant current circuit.

2. The optical transmitter equipment of claim 1, wherein the first and second semiconductor lasers are each a member selected from the group consisting of Fabry-Perot type, distributed feedback type, distributed Bragg reflector, and vertical cavity surface emitting laser.

* * * * *